THERMOELECTRIC ASSEMBLY

Filed Oct. 20, 1966 2 Sheets-Sheet 1

INVENTORS
THEODORE S. WEISSMANN
TELEPHORE L. CHARLAND
JACKSON ST. CLAIR NEAL

BY Robert S. Berger
ATTORNEY

May 5, 1970 T. L. CHARLAND ET AL 3,510,362

THERMOELECTRIC ASSEMBLY

Filed Oct. 20, 1966 2 Sheets-Sheet 2

INVENTORS
THEODORE S. WEISSMANN
TELEPHORE L. CHARLAND
JACKSON ST. CLAIR NEAL

BY Robert L. Berger
ATTORNEY

United States Patent Office 3,510,362
Patented May 5, 1970

3,510,362
THERMOELECTRIC ASSEMBLY
Telesphore L. Charland and Jackson S. Neal, Baltimore, and Theodore S. Weissmann, Randallstown, Md., assignors, by mesne assignments, to Teledyne, Inc., Los Angeles, Calif., a corporation of Delaware
Filed Oct. 20, 1966, Ser. No. 588,115
Int. Cl. G21h *1/10;* H01v *1/06*
U.S. Cl. 136—202 11 Claims

ABSTRACT OF THE DISCLOSURE

An electrically conductive fluid is carried within a cavity formed by thermoelectric elements having a circularly bounded face and shoe means having a spherically concave face to insure good thermal and electrical bond therebetween.

The present invention relates to thermoelectric assemblies. Thermoelectric assemblies employ N and P type elements electrically connected in series in alternate sequence, and the alternate junctions of the sequence operate at substantial thermal differentials. The respective groups of hot and cold junctions are usually arranged in closely spaced arrays for thermal design purposes, and thermoelectric elements are positioned generally parallel to each other, bridging between the locus of the two respective arrays of junctions for design purposes.

It has long been recognized that serious problems arise in the construction of such thermoelectric assemblies, since during their operation, heavy thermal gradients are set up along the length of the thermoelectric elements, and in many cases, such elements comprise fragile semiconductive material. Transverse dimensional changes in the elements pose serious problems where the same are rigidly bonded to metallic components having different coefficients of thermal expansion. Consequently, involved expedients have been employed to accommodate the resultant dimensional changes which occur in the thermoelectric elements between their inoperative and operational regimes, as well as during the initial formation of the conventional rigid bond. To obtain extended operating life at design efficiency, it is necessary to accommodate dimensional and directional variations, while at the same time assuring complete and highly efficient thermal and electrical bonds to the thermoelectric elements.

High thermal gradients and resulting relatively high dimensional changes are particularly encountered in thermoelectric generator assemblies, where the hot junctions are maintained at temperatures highly elevated over that of the cold junctions. The present invention is particularly directed to such devices. The structures disclosed in the present invention are, however, equally applicable to thermoelectric assemblies employed for the purpose of supplying heat at the hot junctions, or a thermal sump at the cold junctions, and may well be required for practical use thereof where the thermal gradients along the elements are high and the temperature of the hot junctions is substantially elevated.

The thermoelectric assemblies of the present invention pertain especially to that class of such devices wherein the proximate ends of adjacent N and P elements are thermally and electrically connected through a solid conductive metallic bridge member or shoe. Each such shoe operates substantially at the same temperature of the adjacent shoes of the same array or arangement, but is necessarily electrially insulated therefrom, inasmuch as its operating potential is at a different value. In such devices, there has been in the past the practice to solder or weld the thermoelectric elements to the bridging member or shoe, effectuating an integral rigid bond which often results in breakage under operation thermal cycling, or on initial cooling during fabrication. Other such devices abut the ends of the thermoelectric elements, under resilient axial compression, against metallic members whose other exposed surface is shaped to a spherical configuration mating with a similar shaped concavity in a second metallic member. This mechanical arrangement permits the accommodation of thermal stresses and dimensional changes, but does not result in efficient electrical and thermal connection with the end face of the respective thermoelectrical elements. Any tendency towards inefficiency in the electrical connections is especially disadvantageous since many such connections exist iteratively in practical thermoelectric assemblies.

The present invention is therefore directed to increasing the efficiency of the thermal and electric bonds to each thermoelectric element in the entire assembly while maintaining physical integrity under thermal cycling. Practice of the invention, therefore, results in a very substantial increase in the efficiency of the device because of the multiplex occurrence of this configuration of parts in the assemblies, as well as a long, effective working life.

The most acute difficulties of the nature described occur at the junctions betwen the thermoelectric elements and the hot shoes, because there the dimensional variation of the shoe, extending between its two adjacent elements, contributes materially to their stress patterns under thermal cyling. The present invention, in fact, takes advantage of highly elevated temperatures, particularly at the hot shoes, to secure a highly efficient but physically resilient and accommodating physical structure.

In particular, the present invention contemplates the use of thermoelectrical elements mounted in a physically adjustable relationship with a metallic shoe, wherein the abutting surfaces of the element and shoe are shaped to provide a cavity which is physically sealed. The cavity is charged with a thermally and electrically conductive metal, thermally liquefiable, or at least plasticizable, at the temperature of operation for the shoe. With this arrangement, the thermoelectrical element may shift its orientation with respect to the shoe under thermal cycling, while retaining the desired highly efficient bond thereto through the plastic or liquid metal body maintained in the cavity. At the same time, the cavity remains sealed under such changes in orientation and the metallic charge in the cavity is accordingly retained for a long useful life. The problem of interface stress in a rigid bond of the hot shoe to the active elements is completely avoided. Hot shoe temperatures of such systems are limited by the melting points of the thermoelectric elements rather than solid interface stress characteristics.

In some preferred embodiments of the present invention, a circularly bounded face of the thermoelectric element is abutted under resilient compressive forces against a concave face of a cavity in the solid metallic shoe. Within the cavity formed between the end of the thermoelectric element and the shoe, a charge of thermal and electrically conductive metallic material is placed, and as this material is fluid, or at least plastic, at the temperature of operation of the assembly, it maintains the desired highly efficient thermal and electrical bond by conforming to whatever configuration may exist under the current thermal conditions between the shoe and the thermoelectric element. In consequence, use of the present invention avoids rigid connections between the element and the shoe which result in stress development, and at the same time, avoids the deficient thermoelectric bonds encountered in mechanical arrangements which, while allowing flexibility in orientation of the shoe with its respective elements, inherently require facewise engagement of solid components. Facewise engagement does not provide any particularly efficient bond under initial operation, and in most instances results in a gradually degrading bond through the life of the thermoelectric assembly.

The construction of the inventive thermoelectric assembly permits radioactive heating by incorporation of suitable isotope material in the plastic or fluid bond material between the hot shoe and the thermoelectric element. This offers especial advantages, particularly for space applications where waste heat disposal becomes difficult, in increasing the efficiency of thermal flux to the hot junctions and minimizing heat losses. Overall efficiency is improved.

It is accordingly the objective of the present invention to provide a highly efficient, but mechanically flexible, bond configuration between thermoelectric elements and their respective shoes, and, in particular, their hot shoes.

The invention will be further described with reference to the specific preferred embodiments disclosed in the drawings, in which.

Figure 1A:
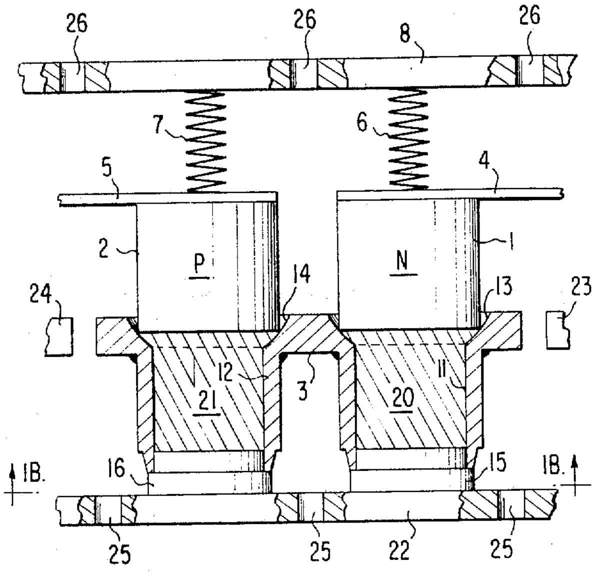
FIGS. 1A and 1B show, respectively, in section, vertical and plan views of a preferred embodiment of the invention.

The thermoelectric assembly shown in FIG. 1A comprises a couple forming a portion of a thermoelectric generator, including a pair of thermoelectric elements 1 and 2, respectively denominated as N and P material. The elements 1 and 2 are each shown as cylindrical bodies terminated with right angular faces intersecting the longitudinal external surfaces in planar circular loci. This configuration provides a circular perimeter for abutment with the shoe, as will appear below. Obviously, the face portions inside the perimeter need not be planar, since it is desired to form a cavity between the element and the shoe without engagement of the element face portions within its perimeter.

In the assembly shown, a hot junction is provided between the two sections by the lower member 3, and the upper members 4 and 5 comprise cold shoes which may be metallurgically rigidly bonded to the respective elements, as by soldering or brazing. The upper shoes maintain the thermoelectric elements in compression by associated resilient structure, shown diagrammatically as springs 6 and 7, abutting between the shoes and fixed element 8. The associated engaging structure includes electrical insulating members (not shown) which establish electrical isolation between shoes 4 and 5, so that these may develop the desired relative electric potentials during the operation of the device.

Lower shoe member 3 is formed with a pair of bores 11 and 12, respectively generally aligned with elements 1 and 2, and terminating exteriorly in concave spherical wall portions 13 and 14. The respective elements 1 and 2 are lapped into sealing engagement with the wall portions 13 and 14, respectively, and maintain a sealing engagement therewith by their compressional bias afforded by the associated resilient structure, such as springs 6 and 7.

Bores 11 and 12 are closed by the respective press-fitted cap structures 15 and 16 to provide a permanently sealed cavity arrangement for retention of their charges of liquefiable metallic material 20 and 21, which provides a permanent electrical and thermal bond between elements 1 and 2 and the hot shoe 3.

Shoe member 3 may be fabricated from Ferro-Vac-E iron, Armco iron or non-magnetic stainless steel. The caps 15 and 16 may be conveniently made of the latter material.

In the portion of the assembly shown in FIG. 1A, the caps are abutted against a backing plate 22 for support and to provide for the compressionalized mounting of the elements 1 and 2 with respect to the shoe 3. It will be understood, of course, that if backing plate 22 is extended to provide a similar mounting for the adjacent hot shoes, whose sections are partially shown at 23 and 24, that suitable electrical insulation will be provided to isolate the adjacent hot shoes.

Convection heating of the hot shoe 3 may be provided by gas inlets, shown diagrammatically at 25, in plate member 22, while cooling of the cold shoes 4 and 5 may be achieved by suitable fluid introduced at apertures 26 of backing plate 8.

During thermal cycling of the assembly, dimensional changes occur in thermal elements 1 and 2, as well as hot shoe 3, and as will be appreciated, the magnitude of these changes is much greater than will occur in cold shoes 4 and 5. Consequently, as hot shoe 3 expands transversely of the section shown in the drawing, elements 1 and 2 will be forced to shift their orientation with respect to the hot shoe, and if cylindrical cavities 11 and 12 were initially aligned with the geometrical axes of elements 1 and 2, such alignment, if established for non-operating condition, would be misaligned at operating temperatures. In the assembly shown, elements 1 and 2 are free to shift their angular configuration with respect to hot shoe 3 while maintaining a sealing engagement between their edges and spherical cavities 13 and 14 of the hot shoe. Since the metallic material charged into the cavity structure formed by the lower surfaces of the thermoelectrical elements 1 and 2, as operationally sealed against shoe 3 with its internal cavities 11 and 12, develops a plastic or liquefied condition as operating temperatures are reached, the charge conforms to the shifting configuration of the respective parts of the assembly, while maintaining a complete and highly efficient thermal and electrical bond between the lower terminal surfaces of the elements and the metallic shoe structure 3. Rigid bond interface stresses, due to difference in coefficients of thermal expansion, are wholly avoided between the elements and the hot shoes.

The thermoelectric assembly shown in FIG. 1A is particularly adapted for utilization of semiconductive thermoelectric materials for application of elements 1 and 2, which accordingly may comprise extremely fragile material and yet provide highly efficient operation of long duration despite repetitive thermal cycling.

In particular, as will appear, doped semiconductive materials affording highly efficient thermoelectric operation may be very effectively utilized with the configuration of the present invention. The bonding material 20 and 21 providing thermal and electrical conduction between shoe 3 and elements 1 and 2 will be described below.

The construction shown in FIG. 1A represents only one of several preferred embodiments according to which the present invention may be constructed, and FIGS. 2A, 3A, 4A, and 5 will be successively described below.

Figure 2A:
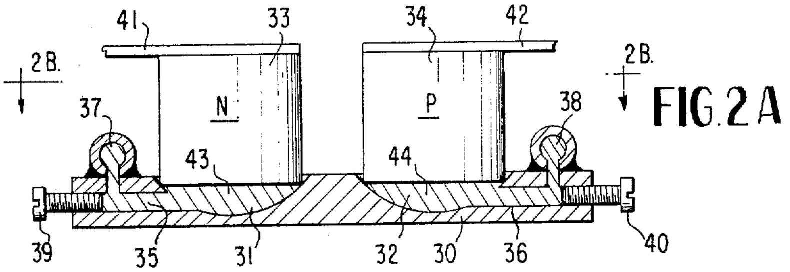
FIGS. 2A and 2B show, respectively, in section, vertical and plan views of another preferred embodiment of the invention.
Figure 2B:
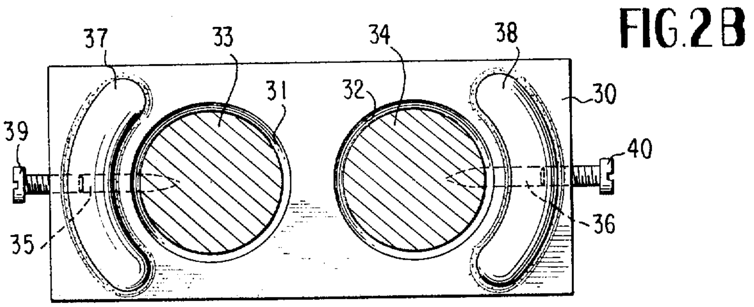

In the thermoelectric assemblies shown in FIGS. 2A and 2B, the hot shoe 30 is fabricated with two partial spherical cavities 31 and 32, each having a periphery at the upper surface of the shoe slightly larger than the diameter of the cylindrical thermoelectric elements 33 and 34. The circular peripheries of these elements are maintained in compression against hot shoe 30 by similar auxiliary structure to that shown in the configuration of the embodiment of FIG. 1A.

Cavities 31 and 32 are respectively connected through conduits 35 and 36 to reservoirs 37 and 38. The exterior terminal portions of conduits 35 and 36 are threaded to receive screws 39 and 40, so that the effective volume of the respective cavities, with that of the conduit and reservoir, may be suitably adjusted in charging these containers with thermally plasticizable or liquefiable metallic material, or an admixture of the same with a radioactive isotope, at 43 and 44.

As in the first-described construction, the thermoelectric elements 33 and 34 are maintained in peripheral, sealing relationship with the spherical concave surfaces of cavities 31 and 32 of hot shoe 30, and consequently maintain the highly effective thermal and electrical bond with shoe 30 through the liquefied metallic material, while at the same time permitting accommodation of the thermoelectric elements to their dimensional variations and those of the associated structures and the hot shoe in particular.

It will be understood that the associated structure of the complete thermoelectric assembly of FIG. 2A will be provided in accordance with the showing of FIG. 1A to maintain the desired compressional relationship. While it is somewhat desirable that the construction be employed with a downwardly directed gravitational field, as shown in the drawing, other orientations, if necessary, may be utilized inasmuch as the inherent surface tension of the plasticized or liquefied metallic material will, in combination with the sealing relationship between the elements and the hot shoe, tend to prevent loss of the metallic material. If such should occur, inward adjustment of screws 39 and 40 will replenish the quantity of such material in the spherical cavities by decreasing the overall capacity of the reservoir, conduit, and cavity system. With the preferred gravitational orientation, metallic material in the cavities 30 and 31 will tend to be maintained and replenished from elevated reservoirs 37 and 38. In low or zero gravitational fields, as in most space applications, the orientation is immaterial.

Figure 3A:
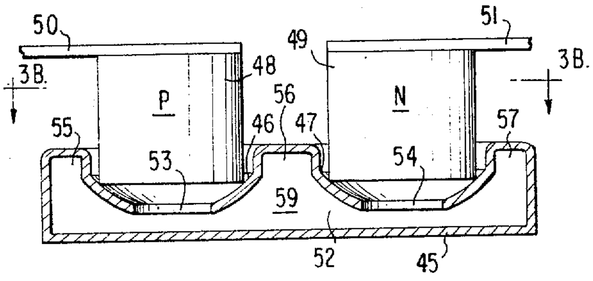
FIGS. 3A and 3B show, respectively, in section, vertical and plan views of a third embodiment of the invention.

The thermoelectric assembly of FIG. 3A comprises a hot shoe 45 fabricated to provide external cavities 46 and 47 of concave spherical configuration, shaped as above described, to receive cylindrical thermoelectric elements 48 and 49. The latter elements are respectively maintained under compression applied through cold shoes 50 and 51.

Figure 3B:
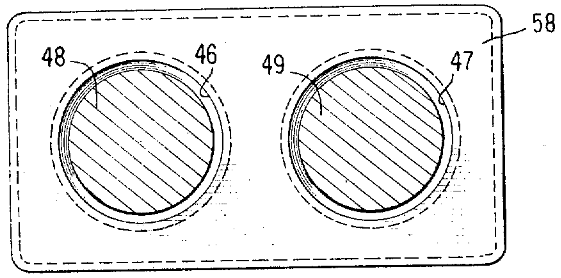

Hot shoe 45 is fabricated to provide an extensive internal cavity 52 communicating respectively with cavities 46 and 47 through apertures 53 and 54. In the somewhat preferred gravitational orientation shown in the drawings, cavity 52 comprises elevated reservoir portions 55, 56, and 57, with its top surface 58, as shown in FIG. 3B, lying in a plane elevated above the zones of contact of the elements with the spherical cavity surfaces.

In operation of the assembly shown in FIG. 3A, the entire internal cavity 52, including the elevated portions 55, 56, and 57, as shown in the sectional view of FIG. 3A, is filled with plasticizable or liquefiable metallic material 59, or similar material admixed with radioactive isotope material for providing a heat source. The material functions for the purpose of maintaining an effective thermal and electrical bond between the thermoelectric elements and the shoe throughout the working life of the assembly. Also, as above described, this structure permits the use of fragile, doped, semiconductive active elements, since on thermal cycling, thermal dimensional and orientational changes can be fully accommodated. Again, the associated mounting structure may be as illustrated in connection with the embodiment of FIG. 1A.

Figure 4A:
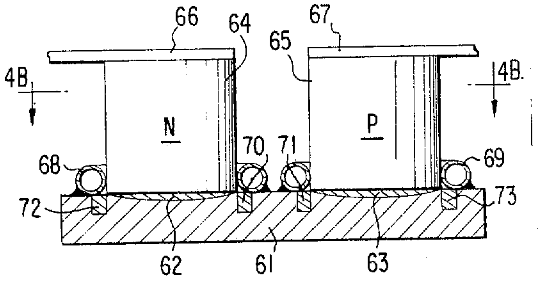
FIGS. 4A and 4B show, respectively, in section, vertical and plan views of a fourth embodiment of the invention.

In the embodiment of FIG. 4A, the hot shoe 61 may be composed of non-magnetic stainless steel and is formed with cavities 62 and 63 depressed below its upper surface and terminated in surfaces which are centrally flat or spherically concave, as shown. Against these surfaces, the thermoelectric elements 64 and 65 are maintained in compression against the hot shoe. The structural elements associated in supporting and positioning hot shoe 61 and cold shoes 66 and 67 may be constructed as shown and described in connection with the embodiment of FIG. 1A.

In the construction of FIG. 4A, the seal for the cavity system retaining plasticizable or liquefiable metallic material forming the thermal and electrical bond between the hot shoe 61 and the active elements 64 and 65 is provided by a thin wall stainless steel O-ring sized in respect to the diameters of the cylindrical elements to provide a resilient seal which is maintained effectively despite the necessary angular and dimensional variations of the configuration under thermal cycling. For this purpose, the resilient O-rings 68 and 69 are welded continuously to shoe 61 externally of their circular zone of contact with the upper surface of the shoe. Underlying each O-ring, internally of its annular engagement with plate 61, are annular channels 70 and 71 which, with the overlying portions of the O-ring structures, constitute relatively elevated reservoir cavity portions charged with metallic material 72 and 73 in the manner above described in connection with the foregoing embodiments.

When these annular channels are charged with plasticizable or liquefiable material, together with the cavities 62 and 63, a highly effective thermal and electrical bond is established and maintained during thermal cycling of the assembly. Alternatively, if the spherical concavities are not provided, and a flat upper surface is fabricated underlying and mating with the lower surfaces of active elements 64 and 65, the inner face is flooded with the liquefiable metallic material which maintains a positive bond throughout the inner face despite the fact that the same may become effectively wedge-shaped as a result of directional change of the elements with respect to the surfaces of hot shoe 63 during thermal cycling. The flexible O-ring comprises resilient means maintaining a seal between the active element and the hot shoe.

Figure 5:
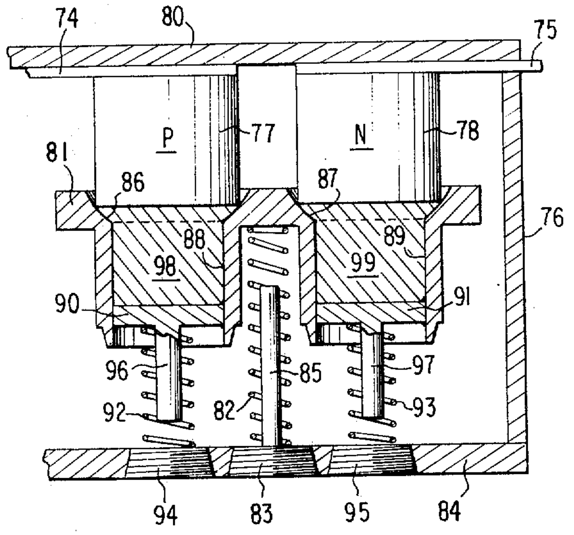
FIG. 5 shows in section another embodiment of the invention.
Figure 4B:
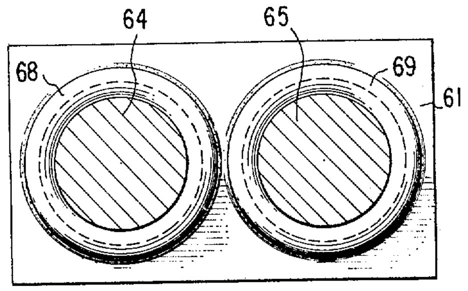

In FIG. 5 is shown in sectional view one couple of a further preferred embodiment of the present invention. Here, within a case shown diagrammatically at 76, are positioned active thermoelectric elements 77 and 78. In the construction shown, each active element may be rigidly metallurgically bonded at its upper face to its cold shoe, shown in part at 74 and 75, the latter extending through case 76 to provide an output terminal. Shoes 74 and 75 are abutted against upper wall 80 of case 76. As in the other examples, should the latter wall portion consist of conductive metallic material, electrical insulation means (not shown) would be interposed between shoes 74 and 75 and wall portion 80. Similarly, insulation may be provided between members 93, 82, 92, and 95, 83, and 94, respectively.

At their lower ends, thermoelectric elements 77 and 78 are engaged by hot shoe 81 which is fabricated essentially in the configuration of the corresponding elements shown in FIG. 1A. The overall assembly, however, includes spring member 82 installed in compression between shoe 81 and plug 83 threaded in the lower wall portion 84 of enclosure 76. Plug 83 carries stud 85 for the purpose of maintaining spring 82 in the desired alignment. As will be understood, the operation of spring 82 maintains elements 77 and 78 in compression and establishes a continuous sealing relationship between the cylindrical active elements and the external concave spherical cavities 86 and 87 of hot shoe 81 which communicate respectively with cylindrical bores 88 and 89 therein. The resultant cavity structures are respectively closed by pistons 90 and 91 inserted in slidable sealing engagement in bores 88 and 89. The two cavity structures provided thereby in hot shoe 81 are filled with a plasticizable or liquefiable metallic material 98, 99, and preferably one carrying admixed therewith, or in solution therewith, a suitable radioactive isotope to provide the heat source for the thermoelectric assembly. The constituent materials of the active elements, and material charged in the respective cavity systems, are to be selected according to the principles discussed above in connection with FIG. 1A.

Springs 92 and 93 are respectively abutted in compression between the pistons and plugs 94 and 95 threaded into the lower wall portion 84 of enclosure 76. Studs 96 and 97 extend outwardly from the respective pistons to maintain alignment with springs 92 and 93. Springs 92 and 93 maintain the charge in the cavities of the hot shoe in continuous contact with the entire lower surfaces of the thermoelectric elements to maintain the desired highly effective thermal and electrical bond between the elements and the hot shoe. In the system disclosed, the compression exerted by spring 82 is selected in substantial excess of the forces exerted by springs 92 and 93.

It will be understood that the thermoelectric assembly shown in part in FIG. 5 substantially achieves the same accommodation of stresses as previously described, particularly in the active elements resulting from thermal cycling, and results in long useful life of the assembly at the desired high electrical and thermal efficiency.

In the five embodiments as described above, which show illustrative applications of the general principles of the present invention, similar principles apply in selecting the constituents for the active thermoelectric elements and the bonding material enclosed in the cavity formed between each thermoelectric element and its hot shoe.

As mentioned above, the invention permits the use of fragile, doped semiconductive material for the thermoelectric elements, and when such materials are employed, the metallic charge employed in the respective cavity should be inert as a dopant to the semiconductive material constituting the thermoelectric element. Additionally, the metallic material charged into and filling the cavities should be at least plastic at the temperature of thermoelectric operation of the assembly. If desired, the metal charge may be thermally liquefied at the temperature of thermoelectric operation of the hot shoe. The prime consideration is that the bonding material filling the cavity between each thermoelectric element and its hot shoe should be deformable and yielding in order to accommodate dimensional and orientational variations of the respective bonded elements.

In a practical assembly constructed as shown in FIGS. 2A and 2B, the hot junction was operated at a temperature of 1320° F. and a cold junction temperature of 150° F. and produced 1.46 watts of electrical power, greater than 70 percent of the theoretical output. The assembly consisted of 0.5 inch diameter x 0.5 inch long lead telluride elements, employing Ferro-Vac-E iron shoes and 50 weight percent indium, 50 weight percent tin as the liquid metal charge in cavities 31 and 32. The P type element was composed of PbTe doped with 0.06 weight percent sodium, and the N type element was composed of Nb (0.85 mol percent), Sn (0.15 mol percent) Te doped with 0.0625 weight percent $PbI_2$. Such thermoelectric elements and metallic cavity charges may be employed in any of the embodiments discussed above, as may others, provided that the bonding metallic material employed therewith is inert as a dopant. In the above example, the thermoelectric elements may be doped in the range of 0.01 to 0.1 weight percent $PbI_2$, or sodium, for the N and P elements, respectively. With such semiconductive material, the metallic material charged in the cavities, such as cavities 11 and 12 of FIGS. 1A and 1B, would necessarily be other than iodine and sodium, since neither would be an inert dopant for this semiconductive material. Bismuth, for instance, would not be a suitable metallic charge for the cavities of the hot shoe in a thermoelectric assembly employing lead telluride active elements. Tin, or tin-indium alloy, would be satisfactorily inert as a dopant for lead tin tellurium semiconductive composition. The following indium base alloys would also be suitable and are commercially available:

80% indium, 15% lead—(melting point 157° C.)
12% indium, 70% tin, 18% lead—(melting point 150°–174° C.)

Suitable tin-lead base alloys which are commercially available include the following additional examples:

40% tin, 60% lead—(liquidus point 236° C.)
60% tin, 40% lead—(liquidus point 188° C.)
80% tin, 20% lead—(liquidus point 199° C.)

In general, the alkali metals are unsuitable liquefiable materials for most, if not all, doped semiconductive elements. On the other hand, indium base alloy with gallium would be generally suitable as an inert dopant for use with semiconductors, and bismuth-cadmium alloys are suitable in particular instances. The commercially available tin and tin-lead base alloys which usually include minor impurity amounts of silicon and iron, are suitable for use in the invention.

Other doped semiconductive materials which may be employed for the active thermoelectric elements are zinc antimonide, silicon-germanium, and the bismuth or germanium tellurides. The invention permits the efficient utilization of these fragile doped semiconductive materials in our novel construction, as well as the following: silver antimony germanium tellurides, germanium bismuth tellurides, bismuth telluride, germanium telluride, silicon-germanium and zinc antimonide.

In designing thermoelectric assemblies embodying the present invention, the hot shoe temperature, if selected as a controlling design parameter, will establish the metals or metal alloy materials which may be used as plastic or fluid at the operating temperature. Materials of a wide range of liquidus points have been mentioned, and many others are well known. Designation of the doped semiconductive material to be used as the thermoelectric elements will then eliminate those otherwise suitable metals or alloys which are not inert as dopants with respect to the selected semiconductor, leaving a wide choice to the design engineer.

Figure 1B:
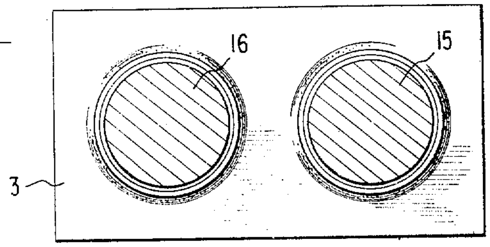

While the thermoelectric assemblies of the present invention may be employed with a convective application of heat to the hot shoe members, such as member 3 of FIGS. 1A and 1B, it will be understood that the heat may be conductively supplied from a radioactive or other heat source. The invention is, moreover, capable of furnishing the heat supply for the hot shoes 3, 30, 45, 61 or 81 of the respective five embodiments, through the incorporation of radioactive material with the metallic charge supplied to the chambers between the thermoelectric elements and the hot shoes.

For this purpose, a suitable amount of radioactive isotope material will be admixed with the plasticizable or liquefiable metal charge to produce the desired operating temperature for the hot junction between the thermoelectric element and the hot shoe. In particular, polonium 210 forms satisfactory solutions with tin, antimony, tellurium and zinc where, as usually is the case, these metals are compatible and inert dopants with respect to the doped semiconductive material employed for the active thermoelectric elements. Similarly, the liquefiable metal composition may comprise 79 atomic percent cerium 144 and 21 atomic percent silver to provide a charge for the cavities which would operate in the liquid phase at a temperature of about 980° F. Additional free cerium may be included.

As another energizing liquefiable metal material charge for the thermoelectric assembly, a eutectic alloy or solution, comprising 84 atomic percent cerium 144 with 16 atomic percent gold, may be used for operation in the liquid phase at about 968° F.

Alternatively, an admixture of 70 atomic percent curium 242, with 30 percent nickel, can be employed to supply an inherent heat source with the above delineated advantages of having a fluid metallic bond for thermal and electrical purposes between the ends of the thermoelectric element and the hot shoe.

Other radioactive isotopes may be used, particularly those with a high power density, long lifetime, and which require little biological shielding. Exemplary radioisotopes include $Sr^{90}$, $Cs^{137}$, $Pm^{147}$, which are primarily beta emitters; $Po^{210}$ and $Pu^{238}$, which are primarily alpha emitters.

The operating temperatures of the above admixtures of radioactive isotopes with plasticizable or liquefiable metallic materials provide a wide design choice to establish the operating temperature at the hot junction. As will be understood, the operating temperature is at least sufficiently high as to plasticize the metallic materials to permit accommodation of dimensional and orientational changes between the respective members of the thermoelectric assembly, while at the same time maintaining the desired thermal and electrical bonds between the thermoelectric elements and the hot shoes themselves.

From the foregoing descriptions, it is believed apparent that many changes can be made in the above constructions and many apparently widely different embodiments of the invention can be made without departing from the scope thereof. Accordingly, it is intended that all matter contained in the above description and shown in the drawings shall be interpreted as illustrative of the scope of the invention defined in the appended claims.

We claim:

1. A thermoelectric assembly comprising: thermoelectric element means, conductive metallic shoe means engaging said element means along a closed locus adjustable in respect to at least one of said means, said thermoelectric element means and said shoe means comprise a circularly bounded face on one of said means and a spherically concave face on the other of said means engaging the periphery only of the circularly bounded face and spaced from the bottom of the concave face to form in combination cavity means therebetween and bond means carried within said cavity means connecting said element means and said shoe means and comprising metal thermally plasticizable at least at the temperature of thermoelectric operation of said shoe means for accommodating relative movement of said element means and said shoe means and for thermally and electrically bonding the shoe means and the element means.

2. The structure as claimed in claim 1, wherein the thermoelectric means includes said circularly bounded face and said shoe means includes said spherically concave face engaging the periphery of the circularly bounded face.

3. The structure as claimed in claim 1, wherein said shoe means further comprises reservoir means in fluid communication with the concave face within the locus of engagement, said reservoir means being charged with the same material as that comprising the bond means.

4. The structure as claimed in claim 3, wherein said reservoir means further includes a bore and adjustable means positioned in the bore to charge said bond means within said cavity.

5. The structure as claimed in claim 4, wherein said adjustable means comprises a piston slidably received in the bore means and spring means biasing said piston towards said bore means.

6. The structure as claimed in claim 1, wherein said bond means comprises admixed radioactive material operative to heat the shoe means to a temperature of thermoelectric operation.

7. A thermoelectric assembly comprising: thermoelectric element means, conductive metallic shoe means engaging said element means along a closed locus adjustable in respect to at least one of said means, said means forming in combination cavity means therebetween, bond means carried by said cavity means connecting said element means and said shoe means and comprising metal thermally plasticizable at least at the temperature of thermoelectric operation of said shoe means for accommodating relative movement of the element means and the shoe means and for thermally and electrically bonding the shoe and the element, said bond means comprising admixed radioactive material operative to heat the shoe means to the temperature of the thermoelectric operation, and reservoir means in fluid communication with said cavity and charged with the same material as that which comprises said bond means.

8. The structure as claimed in claim 7, wherein said reservoir means includes a bore, and adjustable means positioned in the bore to variably charge said cavity with said bond means.

9. The structure as claimed in claim 8, wherein said adjustable means comprises a piston slidably received within said bore and spring means biasing said piston towards said cavity.

10. The structure as claimed in claim 9, wherein said resilient means comprises an O-ring forming part of the shoe means and in contact with said thermoelectric element means.

11. The structure as claimed in claim 7, wherein said bond means comprises admixed radioactive material operative to heat the shoe means to the temperature of the thermoelectric operation.

References Cited

UNITED STATES PATENTS

| | | | |
|---|---|---|---|
| 2,952,725 | 9/1960 | Evans et al. | 136—237 X |
| 3,022,360 | 2/1962 | Pietsch | 136—237 X |
| 3,075,030 | 1/1963 | Elm et al. | 136—202 X |
| 3,296,033 | 1/1967 | Scuro et al. | 136—205 |
| 3,304,207 | 2/1967 | Kolb | 136—211 |
| 3,362,853 | 1/1968 | Valdsaar | 136—205 |

ALLEN B. CURTIS, Primary Examiner

U.S. Cl. X.R.

136—205, 237